(12) United States Patent
Iyer et al.

(10) Patent No.: US 9,603,252 B1
(45) Date of Patent: Mar. 21, 2017

(54) INTEGRATED CIRCUIT DEVICE SYSTEM WITH ELEVATED CONFIGURATION AND METHOD OF MANUFACTURE THEREOF

(71) Applicant: SMART Modular Technologies, Inc., Newark, CA (US)

(72) Inventors: Satyanarayan Shivkumar Iyer, Fremont, CA (US); Reuben J. Chang, Campbell, CA (US); Victor Mahran, Ladera Ranch, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 169 days.

(21) Appl. No.: 14/077,908

(22) Filed: Nov. 12, 2013

(51) Int. Cl.
  H05K 1/11 (2006.01)
  H05K 1/14 (2006.01)
  H05K 1/18 (2006.01)
  H05K 3/30 (2006.01)

(52) U.S. Cl.
  CPC ............ H05K 1/181 (2013.01); H05K 3/303 (2013.01)

(58) Field of Classification Search
  CPC ........... G11C 5/04; H05K 1/141; H05K 1/144
  USPC ........ 174/255, 260, 261; 361/749, 760, 792, 361/803
  See application file for complete search history.

(56) References Cited

U.S. PATENT DOCUMENTS

| | | | |
|---|---|---|---|
| 6,051,878 A | 4/2000 | Akram et al. | |
| 6,576,992 B1* | 6/2003 | Cady | H01L 23/3114 174/254 |
| 6,614,664 B2 | 9/2003 | Lee | |
| 7,095,104 B2 | 8/2006 | Blackshear | |
| 7,358,444 B2 | 4/2008 | Nickerson et al. | |
| 8,350,373 B2 | 1/2013 | Wu | |
| 8,379,391 B2 | 2/2013 | Amidi et al. | |
| 2002/0079568 A1 | 6/2002 | Degani et al. | |
| 2003/0111242 A1* | 6/2003 | Radu | G06F 1/182 174/363 |
| 2006/0067054 A1* | 3/2006 | Wang | H01L 23/3672 361/704 |
| 2008/0036061 A1* | 2/2008 | Chainer | H01L 21/486 257/686 |
| 2009/0032926 A1* | 2/2009 | Sharifi | H01L 23/13 257/686 |
| 2009/0185045 A1* | 7/2009 | Rosenblatt | H04N 5/2254 348/222.1 |
| 2009/0279243 A1* | 11/2009 | Amidi | G11C 5/04 361/679.31 |

(Continued)

OTHER PUBLICATIONS

U.S. Appl. No. 14/231,622, Non-Final Office Action dated Jun. 24, 2014.

(Continued)

*Primary Examiner* — Yuriy Semenenko
(74) *Attorney, Agent, or Firm* — Wong & Rees LLP

(57) ABSTRACT

A system and method of manufacture of an integrated circuit device system includes: a carrier having a first side; a base device mounted on the first side; a first riser mounted on the first side; a second riser mounted on the first side and adjacent to the first riser; a peripheral elevated device mounted on the first riser, the peripheral elevated device having a device overhang above the base device; and an inner elevated device mounted on the second riser, the inner elevated device having the device overhang above the base device.

20 Claims, 6 Drawing Sheets

(56) References Cited

U.S. PATENT DOCUMENTS

2010/0079966 A1* 4/2010 Baek .................. G06F 11/1044
                                                    361/783
2013/0027875 A1  1/2013 Zhu et al.
2013/0083473 A1  4/2013 Mahran et al.

OTHER PUBLICATIONS

U.S. Appl. No. 14/231,622, Non-Final Office Action dated Oct. 9, 2015.
U.S. Appl. No. 14/231,622, Non-Final Office Action dated Dec. 8, 2015.
U.S. Appl. No. 14/231,622, Final Office Action dated Apr. 19, 2016.
U.S. Appl. No. 14/231,622, Advisory Action dated Jun. 27, 2016.

* cited by examiner

INTEGRATED CIRCUIT DEVICE SYSTEM WITH ELEVATED CONFIGURATION AND METHOD OF MANUFACTURE THEREOF

TECHNICAL FIELD

The present invention relates generally to an integrated circuit device system, and more particularly to a system with an elevated configuration.

BACKGROUND ART

There is a continual need in the area of electronics and electronic computing systems toward smaller systems and/or systems with greater computing performance for a given space. Within these systems, the integrated circuit and memory modules are the building block used in a high performance electronic system to provide applications for usage in products such as automotive vehicles, computers, cell phone, intelligent portable military devices, aeronautical spacecraft payloads, and a vast line of other similar products that require small compact electronics supporting many complex functions.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry, memory capacity, and the amount of electrical connections inside a product are key to improving the features, performance, and reliability of any product. Furthermore, the ways the circuitry and electrical connections are implemented can determine the device size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system for improved performance, yield, thermal cooling, low profile, and improved reliability. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit device system, including: providing a carrier having a first side; mounting a base device on the first side; mounting a first riser and a second riser on the first side; mounting a peripheral elevated device on the first riser, the peripheral elevated device having a device overhang above the base device; and mounting an inner elevated device on the second riser, the inner elevated device having the device overhang above the base device.

The present invention provides an integrated circuit device system including: a carrier having a first side; a base device mounted on the first side; a first riser mounted on the first side; a second riser mounted on the first side and adjacent to the first riser; a peripheral elevated device mounted on the first riser, the peripheral elevated device having a device overhang above the base device; and an inner elevated device mounted on the second riser, the inner elevated device having the device overhang above the base device.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
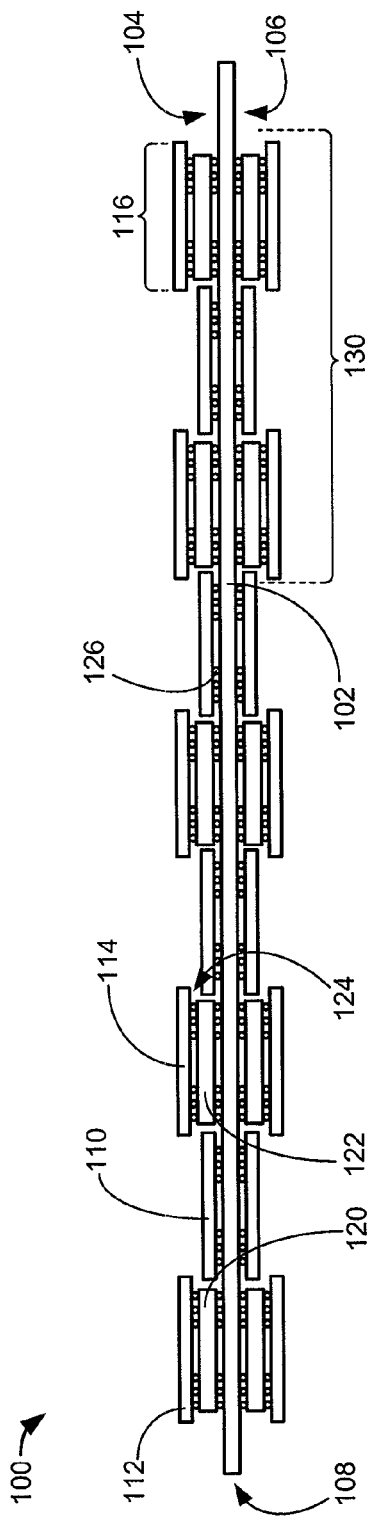
FIG. 1 is a top view of the integrated circuit device system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

The same numbers are used in all the drawing FIGS. to relate to the same elements. The embodiments have been numbered first embodiment, second embodiment, etc. as a matter of descriptive convenience and are not intended to have any other significance or provide limitations for the present invention.

The term "active side" refers to a side of a die, a module, a package, or an electronic structure having active circuitry fabricated thereon or having elements for connection to the active circuitry within the die, the module, the package, or the electronic structure.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means there is direct physical contact between elements. The term "directly on" means there is direct physical contact between elements with no intervening elements. The term "overhang" as used herein includes an object suspended over another object with a portion of both objects directly facing each other. The first object suspended over the second object do not touch or are not in direct contact with each other.

Referring now to FIG. 1, therein is shown a top view of an integrated circuit device system 100 in a first embodiment of the present invention. The top view can depict a view of the integrated circuit device system 100 that is inserted into another system or device (both not shown). The integrated circuit device system 100 can include a carrier 102, integrated circuit devices, a first riser 120, and a second riser 122.

The carrier 102 provides structural support for components and semiconductor devices mounted thereon. For example, the carrier 102 can be a printed circuit board (PCB) for mounting memory device such as dynamic random access memory (DRAM) module units.

Further for example, the carrier can be a substrate including semi-conductive material, a core of conductive material, metal, or alloy such as copper as an example. The carrier 102 can include a first side 104 and a second side 106 opposite to the first side 104. The carrier 102 can also include a peripheral end 108, which is end side of the carrier 102 perpendicular to the first side 104 and the second side 106.

The integrated circuit device system 100 can include a number of integrated circuit devices including a base device 110, a peripheral elevated device 112, and an inner elevated device 114. The base device 110, the peripheral elevated device 112, and the inner elevated device 114 can be integrated circuit devices, chips, or semiconductor devices.

The base device 110 is defined as a semiconductor device having one or more integrated transistors for implementing active circuitry. For example, the base device 108 can include interconnects, passive devices, or a combination thereof. The base device 110 is directly attached to the first side 104 of the carrier 102. The base device 110 is preferably shown in a flip-chip configuration.

The peripheral elevated device 112 is defined as a semiconductor device having one or more integrated transistors for implementing active circuitry. For example, the peripheral elevated device 112 can include interconnects, passive devices, or a combination thereof. The peripheral elevated device 112 is arranged at the periphery of the carrier 102 directly adjacent to the peripheral end 108, with no intervening components between the periphery end 108 and the peripheral elevated device 112. The peripheral elevated device 112 can also be a peripheral stacked device.

The peripheral elevated device 112 is elevated, mounted, or stacked above the base device 110 having a top surface of the peripheral elevated device 112 above a top surface of the base device 110. The peripheral elevated device 112 is preferably shown in a flip-chip configuration.

The inner elevated device 114 is defined as a semiconductor device having one or more integrated transistors for implementing active circuitry. For example, the inner elevated device 114 can include interconnects, passive devices, or a combination thereof. The inner elevated device 114 is arranged away from the periphery of the carrier 102 with the base device 110 between the inner elevated device 114 and the peripheral elevated device 112. The inner elevated device 114 can also be a peripheral stacked device.

The inner elevated device 114 is elevated, mounted, or stacked above the base device 110 having a top surface of the inner elevated device 114 above a top surface of the base device 110. The inner elevated device 114 is preferably shown in a flip-chip configuration.

The base device 110, the peripheral elevated device 112, and the inner elevated device 114 can be interchangeable and only differ by the arrangement of the devices on the carrier 102. For example, the base device 110, the peripheral elevated device 112, and the inner elevated device 114 can be uniform or standardized chips having identical dimensions. The base device 110, the peripheral elevated device 112, and the inner elevated device 114 can also include or be a component of covered packaged integrated circuits such as a ball grid array (BGA), chip-scale package (CSP), as well as include bare die configurations.

Further for example, the peripheral elevated device 112, the base device 110, and the inner elevated device 114 can have identical sides, components, and functions. For example, the top and bottom sides of the inner elevated device 114 can be coplanar to the top and bottom sides of the peripheral elevated device 112. The peripheral elevated device 112, the base device 110, and the inner elevated device 114 can be DRAM units with the dimensions of 8.5 millimeters (mm)×11 mm×1.10 mm.

The base device 110, the peripheral elevated device 112, and the inner elevated device 114 can include a length 116 for measuring a lateral side of the base device 110, the peripheral elevated device 112, and the inner elevated device 114. The length 116 is defined as a measurement of a side taken from the direction of the peripheral end 108 to another of the peripheral end 108 at the opposite side of the carrier 102.

The integrated circuit device system 100 can include a first riser 120 and a second riser 122, which are defined as structures for elevating the peripheral elevated device 112 and the inner elevated device above the base device 110. The first riser 120 and the second riser 122 can preferably be interposers, although the first riser 120 and the second riser 122 can include other chips or structures that can redistribute an electrical connection. The first riser 120 and the second riser 122 can be mounted to the first side 104 of the carrier 102.

The first riser 120 can be immediately adjacent to the peripheral end 108. The peripheral elevated device 112 can be mounted directly on the first riser 120 for elevating the peripheral elevated device 112 above the base device 110. The inner elevated device 114 can be mounted directly on the second riser 122 for elevating the inner elevated device 114 above the base device 110. The base device 110 can be mounted between the first riser 120 and the second riser 122 on the first side 104.

The first riser 120 can be identical to the second riser 122. The first riser 120 and the second riser 122 can include vias for providing a vertical 410 or "z-type" 412 electrical connection between components and the carrier 102. The first riser 120 and the second riser 122 can include the dimensions of 7.25 mm×11 mm×1.27 mm.

The first riser 120 allows the peripheral elevated device 112 to have a device overhang 124 or chip overhang. The device overhang 124 is an overlapping of an elevated device over components, such as the base device 110 or the carrier 102. The device overhang 124 includes overlapping without the elevated device touching or being in direct contact with a component below the elevated device. For example, the second riser 122 allows the inner elevated device 114 to have the device overhang 124 above the base device 110. A portion of the peripheral elevated device 112 and a portion of the inner elevated device 114 can be suspended over and directly facing a top surface of the base device 110. The device overhang 124 can also include molding or encapsulation material within the space provided by the device overhang 124.

The device overhang 124 can include a measurable amount for the overlap or overhang. For example, the device overhang 124 can include a value such as 0.63 mm to 0.14 mm for the length 116 of the device overhang 124. The device overhang 124 can also include a measurement such as a ratio of a dimension of the elevated or stacked chip. For example, the device overhang 124 can include fifty percent to zero percent of the length 116 of the peripheral elevated device 112, which overhangs the base device 110 or the carrier 102.

Further for example, the lateral overlap can be anywhere from zero to half the length 116 of the peripheral elevated device 112 or the inner elevated device 114. The device overhang 124 can be more than half the length 116 of the peripheral elevated device 112 or the inner elevated device 114, provided that the peripheral elevated device 112 and the inner elevated device 114 are not in direct contact with each other.

The integrated circuit device system 100 can include a device interconnect 126 for connecting components to other components or the carrier 102. The device interconnect 126 provides an electrical connection and can include a solder ball, solder bump, or a solder pillar as examples. The device interconnect 126 can attach the first riser 120, the second riser 122, and the base device 110 to the carrier 102. The device interconnect 126 can attach the peripheral elevated device 112 and the inner elevated device 114 to the first riser 120 and the second riser 122.

The integrated circuit device system 100 can include a mirrored chip assembly 130 attached to the second side 106 of the carrier 102. The mirrored chip assembly 130 can include an identical copy of the base device 110, the peripheral elevated device 112, the inner elevated device 114, the first riser 120, and the second riser 122, where the identical components are attached to the second side 106. For example, the second side 106 can include an identical copy of the first riser 120, which is positioned or mounted on the same location but on the opposite side of the carrier 102. The mirrored chip assembly 130 will be described in further detail below.

It has been discovered that the configuration and spacing of the base device 110, the peripheral elevated device 112, the inner elevated device 114, the first riser 120, and the second riser 122 provides additional space on the carrier 102 for increasing the capacity of carrier 102 to hold more devices.

It has been found that the elevated or stacked arrangement of chips on the first riser 120 and the second riser 122 provide for the peripheral elevated device 112 and the inner elevated device 114 to be elevated or stacked above the base device 110 for increasing the capacity of devices on the carrier 102. For example, the device overhang 124, where the peripheral elevated device 112 and the inner elevated device 114 are suspended over the base device 110 and the carrier 102 increases the mountable area for mounting memory modules.

It has been found that the elevated or stacked configuration and arrangement of the integrated circuit device system 100 can be used with standardized and uniform devices or customized devices with different sizes and dimensions. For example, the elevated arrangement and the device overhang 124, from the first riser 120 and the second riser 122, provide a system that allows uniform sized chips and chips with different dimensions to be mounted on the carrier 102.

Further, it has been found that the device overhang 124 allows for devices of different sizes to be arranged on the carrier 102. For example, the base device 110 can have a different value for the length 116 than the peripheral elevated device 112 and the inner elevated device 114. Further for example, the device overhang 124 allows the peripheral elevated device 112 and the inner elevated device 114 to have different lengths or different overlaps with the base device 110. The variations between the lengths of the peripheral elevated device 112 and the inner elevated device 114 are limited by the mounting space on the carrier 102 and the space required to keep chips from contacting each other.

It has been found that the overlapping configuration of the integrated circuit device system 100 provides cooling and air flow in combination with the increased amount of chips mounted in the same mounting area. Further, it has been found that the heights, spaces, and distances between the base device 110, the peripheral elevated device 112, the inner elevated device 114, the first riser 120, and the second riser 122 provides for air cooling and for buffering space to prevent physical damage between components from temporary warpage and component shifting.

Further, it has been found that the mirrored chip assembly 130 further increases the capacity of devices that can be mounted on the carrier 102. The base device 110, the peripheral elevated device 112, the inner elevated device 114, the first riser 120, and the second riser 122 can have an identical copy in the mirrored chip assembly 130 mounted to the second side 106.

It has been also found that the mirrored chip assembly 130 allows for an identical manufacturing process for the second side 106 as for the first side 104, which simplifies manufacturing steps and increases production yield.

Figure 2:
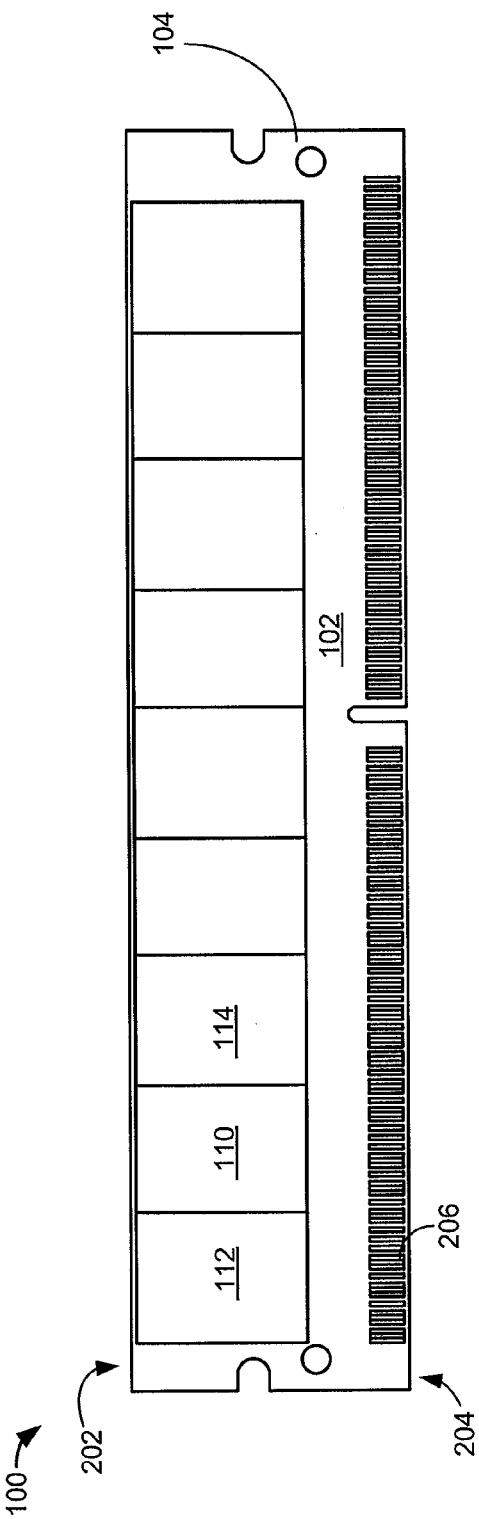
FIG. 2 is a side view of the first side of the integrated circuit device system of FIG. 1.

Referring now to FIG. 2, therein is shown a side view of the integrated circuit device system 100 of FIG. 1. The side view shows the first side 104 of the carrier 102 including the peripheral elevated device 112, the base device 110, and the inner elevated device 114.

The carrier 102 can include an extraction end 202 and an insertion end 204 opposite to the extraction end 202. The extraction end 202 can be used to physically remove the integrated circuit device system 100 from other systems, devices, sockets, boards, or a combination thereof. The insertion end 204 can include a carrier interconnect 206 for connecting the carrier 102 to other systems, devices, sockets, boards, or a combination thereof The carrier interconnect 206 provides an electrical connection between the carrier 102 and external systems (not shown). The carrier interconnect 206 can include contacts, pads, or leads. The carrier interconnect 206 can be exposed from the first side 104 of the carrier 102 at the insertion end 204 of the carrier 102.

Figure 3:
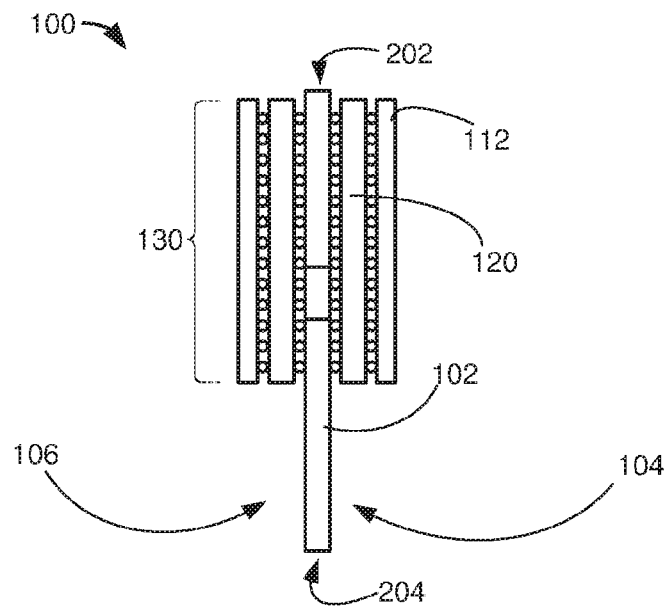
FIG. 3 is a peripheral end view of the integrated circuit device system of FIG. 1.

Referring now to FIG. 3, therein is shown a peripheral end view of the integrated circuit device system 100 of FIG. 1. The peripheral end view can depict the first side 104 and the second side 106 of the carrier 102. The peripheral end view can include the insertion end 204, the extraction end 202, the peripheral elevated device 112, the first riser 120, and a portion of the mirrored chip assembly 130.

The peripheral elevated device 112 is coplanar to the first riser 120 and the mirrored chip assembly 130 at the extraction end 202. A portion of the carrier 102 at the extraction end 202 is shown protruding beyond the peripheral elevated device 112, the first riser 120, and a portion of the mirrored chip assembly 130.

It has been found that the protrusion of the carrier 102 at the extraction end 202 provides structural support and protection from physical damage for the peripheral elevated device 112, the first riser 120, and a portion of the mirrored chip assembly 130 at the extraction end 202.

Figure 4:
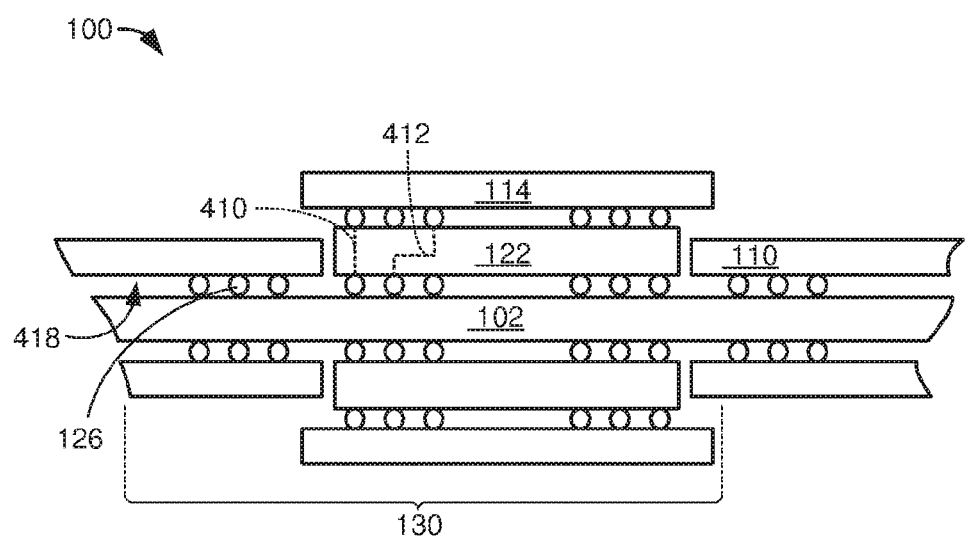
FIG. 4 is a detailed view of the integrated circuit device system of FIG. 1

Referring now to FIG. 4, therein is shown a detailed view of the integrated circuit device system 100 of FIG. 1. For illustrative purposes, the detailed view can be used to highlight example dimensions and measurements for the integrated circuit device system 100 in a low profile and high chip density configuration.

The detailed view can include the carrier 102, the base device 110, the inner elevated device 114, the second riser 122, and a portion of the mirrored chip assembly 130. The detailed view can illustrate the gaps and spaces between the base device 110, the inner elevated device 114, the second riser 122, and the device interconnect 126.

The component dimensions, gaps, and spaces of the mirrored chip assembly 130 can be identical to the component dimensions, gaps, and spaces of the base device 110, the inner elevated device 114, and the second riser 122. The base device 110 can include an interconnect side 418, which is the active side for interconnection of the chip.

For example, the device interconnect 126 can have a height of 0.30 millimeters (mm) measured from the first side 104 of FIG. 1 to the interconnect side 418 of base device 110 or the second riser 122. The vertical height of 0.30 mm provides sufficient space for airflow but also maintains a low profile for the integrated circuit device system 100. The height of the inner elevated device 114, measured from the first side 104 to the top surface of the inner elevated device 114, can be 2.50 mm.

Further for example, the height of the second riser 122 can be 1.10 mm measured from the bottom surface of the second riser 122 to the top surface of the second riser 122. The length 116 of FIG. 1 of the second riser 122 can be 7.15 mm. The pitch distance between the device interconnect 126 and another of the device interconnect 126 can be 0.80 mm. The dimensions of the second riser 122 can be identical to the dimensions of the first riser 120 of FIG. 1.

The gap or space between the top surface of the base device 110 and the bottom surface of the inner elevated device 114 can include a height of 0.60 mm. The spaces and gaps between components of the integrated circuit device system 100 allow for temporally warpage of the carrier 102 without damaging adjacent components. For example, the inner elevated device 114 with a gap or separation of 0.60 mm from the top surface of the base device 110 provides slack and provides buffer space for preventing damage from physical contact.

It has been found that the overlapping configuration of the integrated circuit device system 100 provides cooling and air flow in combination with an increased amount of chips mounted in the same area. Further, it has been found that the heights and distances between the base device 110, the peripheral elevated device 112, the inner elevated device 114, the first riser 120, and the second riser 122 provides for a buffer space to prevent physical damage from temporary warpage and component shifting.

It has been found that the total assembly height of 2.50 mm, the length 116 of the second riser 122, and the elevated and overlapping configuration of the integrated circuit device system 100 provides for a low profile and high chip density configuration in a memory device. For example, the heights and dimensions of the components of the integrated circuit device system 100, such as the height of the inner elevated device 114 and the length 116 of the second riser 122, increases the amount of memory devices that can be mounted to the carrier 102 but also maintains a low device profile.

Figure 5:
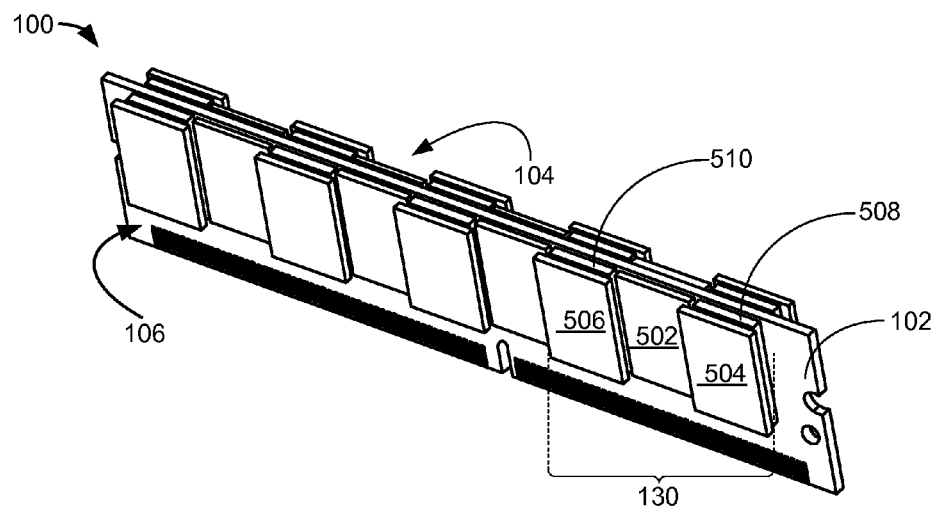
FIG. 5 is an isometric view of the integrated circuit device system of FIG. 1.

Referring now to FIG. 5, therein is shown an isometric view of the integrated circuit device system 100 of FIG. 1. The isometric view can depict the components of the mirrored chip assembly 130. The mirrored chip assembly 130 can be attached to the second side 106 of the carrier 102 and include a mirrored base device 502, a mirrored peripheral device 504, a mirror inner device 506, a mirrored first riser 508, and a mirrored second riser 510.

The mirrored base device 502 can be identical to the base device 110 of FIG. 1 except that the mirrored base device 502 is mounted to the second side 106. The mirrored peripheral device 504 can be identical to the peripheral elevated device 112 of FIG. 1 except that the mirrored peripheral device 502 is connected to the second side 106.

The mirrored inner device 506 can be identical to the inner elevated device 114 of FIG. 1 except that the mirrored inner peripheral device 502 is connected to the second side 106. The mirrored first riser 508 can be identical to the first riser 120 of FIG. 1 except that the mirrored first riser 508 is mounted to the second side 106. The mirrored second riser 510 can be identical to the second riser 122 of FIG. 1 except that the mirrored second riser 510 is mounted to the second side 106.

It has been found that the mirrored chip assembly 130 provides a higher density module without the use of additional packaging materials or conventional dual-die-packages (DDP). Thus, it has been found that the mirrored chip assembly 130 attached to the second side 106 with the base device 110, the peripheral elevated device 112, and the inner elevated device 114 attached to the first side 104 increases device capacity while decreasing the number of ranks required.

It has also been found that the mirrored chip assembly 130 further increases the capacity of devices that can be mounted on the carrier 102. The base device 110, the peripheral elevated device 112, the inner elevated device 114, the first riser 120, and the second riser 122 can have an identical copy in the mirrored chip assembly 130 mounted to the second side 106. Further it has been found that the mirrored chip assembly 130 allows for an identical manufacturing process for the second side 106 as for the first side 104, which simplifies manufacturing steps and increases production yield.

Figure 6:
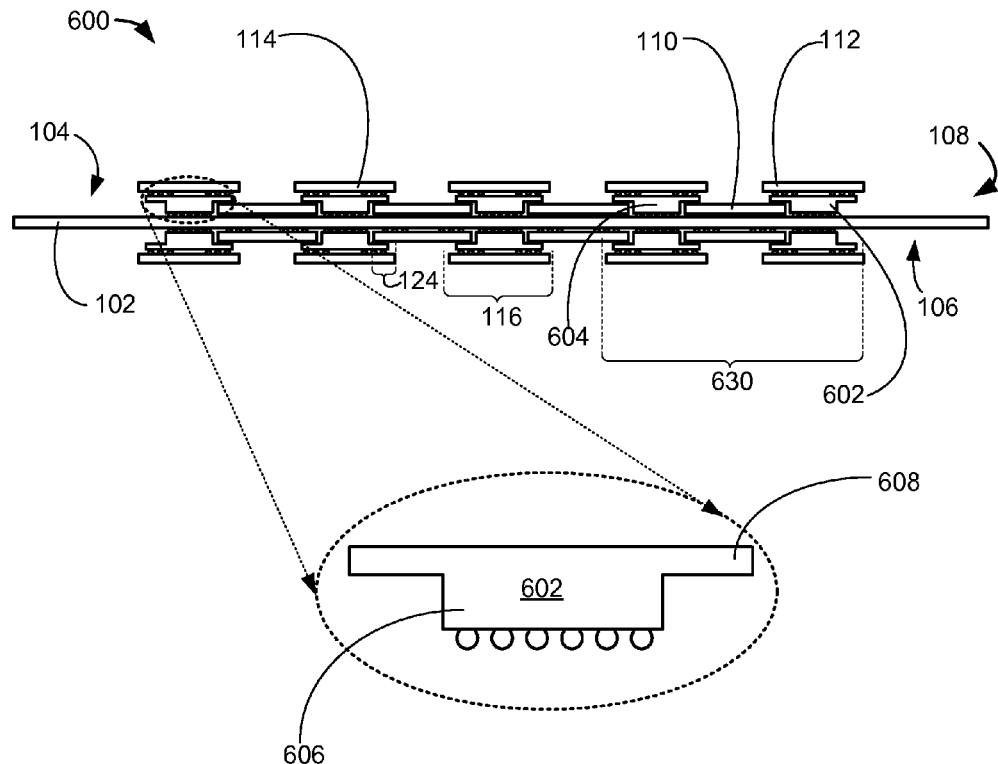
FIG. 6 is a top view of the integrated circuit device system in a second embodiment of the present invention.

Referring now to FIG. 6, therein is shown a top view of the integrated circuit device system 600 in a second embodiment of the present invention. The integrated circuit device system 600 and be identical to the integrated circuit device system 100 of FIG. 1 except that the integrated circuit device system 600 can include a first riser 602 and a second riser 604, both with a "T-shaped" configuration.

It is understood that the integrated circuit device system 600 can include identical elements and components as the integrated circuit device system 100. For example, the integrated circuit device system 600 can include the base device 110, the peripheral elevated device 112, the inner elevated device 114, and the device interconnect 126 of FIG. 1.

The first riser 602 can include a body portion 606 and a protrusion portion 608. The body portion 606 of the first riser 602 provides a base for components and devices mounted thereon. The body portion 606 is mounted directly to the carrier 102. The first riser 602 can be identical to the second riser 604.

The protrusion portion 608 of the first riser 602 extends from the body portion 606. The protrusion portion 608 can protrude towards the peripheral end 108 of the carrier and towards another of the peripheral end 108 at the opposite end of the carrier 102. The protrusion portion 608 and the top surface of the first riser 602 can provide additional mounting space for components to be mounted above the carrier 102 and the base device 110.

The protrusion portion 608 can overhang the base device 110, allowing for a narrower body portion 606 for increasing mounting space for components mounted directly to the carrier 102. For example, the base device 110 and another of the base device 110 can be mounted closer together because the space required from the body portion 606 is reduced.

The protrusion portion 608 can overhang the base device 110. For example, the protrusion portion 608 can overlap the base device 110 including the length 116 of 0.14 mm to 0.20 mm. The peripheral elevated device 112 and the inner elevated device 114 can include the device overhang 124, which overlaps the base device 110 and the carrier 102.

The first riser 602 and the second riser 604 can also include a redistribution layer and vias for interconnection between the carrier 102, the peripheral elevated device 112, and the inner elevated device 114. The length 116 between an outer edge of the peripheral elevated device 112 and another of the peripheral elevated device 112 at the opposite end of the carrier 102 can be 61.15 mm.

The integrated circuit packaging system 600 includes a mirrored chip assembly 630. The mirrored chip assembly 630 can be identical to the mirrored chip assembly 130 of FIG. 1 except that the mirrored chip assembly 630 includes the first riser 602 and the second riser 604.

It has been discovered that the body portion 606 and the protrusion portion 608 of the first riser 602 and the second riser 604 further increases the capacity of carrier 102 to hold more devices. It has been found that the narrow dimensions of the body portion 606 provide for more chips or longer chips to be mounted to the carrier 102. It has been found that the protrusion portion 608 provides for devices of multiple sizes to be mounted above the base device 110 because of the protrusion portion 608 extends the mounting area beyond the length 116 of the body portion 606.

It has been discovered that the configuration and spacing of the base device 110, the peripheral elevated device 112, the inner elevated device 114, the first riser 602, and the second riser 604 provides additional space on the carrier 102 for increasing the capacity of carrier 102 to hold more devices.

It has been found that the elevated or stacked arrangement of chips on the first riser 602 and the second riser 604 provide for the peripheral elevated device 112 and the inner elevated device 114 to be elevated above the base device 110 for increasing the capacity of devices on the carrier 102. For example, the device overhang 124, where the peripheral elevated device 112 and the inner elevated device 114 are suspended over the base device 110 and the carrier 102, increases the mountable area for mounting memory modules.

It has been found that the elevated or stacked configuration and arrangement of the integrated circuit device system 600 can be used with standardized and uniform devices or customized devices with different sizes and dimensions. For example, the elevated arrangement and the device overhang 124 provided by the first riser 602 and the second riser 604 provide a system that allows uniform sized chips and chips with different dimensions to be mounted on the carrier 102.

Further, it has been found that the device overhang 124 allows for devices of different sizes to be arranged on the carrier 102. For example, the base device 110 can have a different value for the length 116 than the peripheral elevated device 112 and the inner elevated device 114. Further for example, the device overhang 124 allows the peripheral elevated device 112 and the inner elevated device 114 to have different lengths or different overlaps with the base device 110. The variations between the lengths of the peripheral elevated device 112 and the inner elevated device 114 are limited by the mounting space on the carrier 102 and the space required to keep chips from contacting each other.

It has been found that the overlapping configuration of the integrated circuit device system 600 provides cooling and air flow in combination with the increased amount of chips mounted in the same mounting area. Further, it has been found that the heights, spaces, and distances between the base device 110, the peripheral elevated device 112, the inner elevated device 114, the first riser 602, and the second riser 604 provides for air cooling and provides for a buffer space to prevent physical damage between components from temporary warpage and component shifting.

Further, it has been found that the mirrored chip assembly 630 further increases the capacity of devices that can be mounted on the carrier 102. The base device 110, the peripheral elevated device 112, the inner elevated device 114, the first riser 602, and the second riser 604 can have an identical copy in the mirrored chip assembly 630 mounted to the second side 106.

It has been also found that the mirrored chip assembly 630 allows for an identical manufacturing process for the second side 106 as for the first side 104, which simplifies manufacturing steps and increases production yield.

Figure 7:
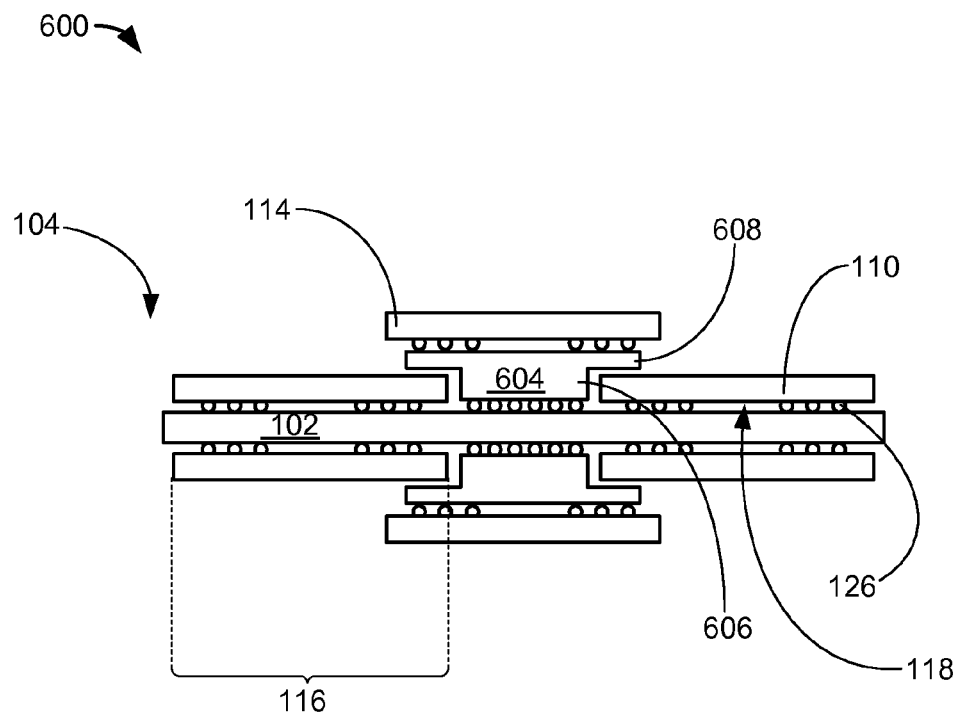
FIG. 7 is a detailed view of the integrated circuit device system of FIG. 6.

Referring now to FIG. 7, therein is shown a detailed view of the integrated circuit device system 600 of FIG. 6. For illustrative purposes, the detailed view can be used to highlight example dimensions and measurements for the integrated circuit device system 600 in a low profile and high chip density configuration.

For example, the device interconnect 126 can have a height of 0.30 mm measured from the first side 104 to the interconnect side 418 of base device 110 or the second riser 604. The height of 0.30 mm provides sufficient space for airflow and cooling but also maintains a low profile for the integrated circuit device system 600.

Further for example, the height of the second riser 604 can be 1.10 mm from the bottom surface of the second riser 604 to the top surface of the second riser 604. The top surface of the second riser 604, including the length 116 of an outer edge of the protrusion portion 608 to another outer edge of the protrusion portion 608 can be 7.15 mm.

The height of the protrusion portion 608 can include a length 116 of 0.60 mm. The length 116 of the body portion 606 can include a length of 4.00 mm, which is measured in the direction of the base device 110 to another of the base device 110. The dimensions of the second riser 604 can be identical to the dimensions of the first riser 120 of FIG. 1 and the second riser 122 of FIG. 1.

Further for example, the gap or space between the top surface of the base device 110 and the bottom surface of the inner elevated device 114 can include a height of 0.60 mm. The spaces and gaps between components of the integrated circuit device system 600 allow temporally warpage and shifting without damaging adjacent components. For example, the inner elevated device 114 with a gap or separation of 0.60 mm from the top surface of the base device 110 provides slack and a buffer space for preventing damage from physical contact.

It has been found that the overlapping configuration of the integrated circuit device system 600 provides cooling and air flow in combination with an increased capacity for mounting chips on the carrier 102. Further, it has been found that the heights, spaces, and distances between the base device 110, the peripheral elevated device 112, the inner elevated device 114, the first riser 602, and the second riser 604 allows for cooling and provides for a buffer space to prevent physical damage from temporary warpage and shifting.

Figure 8:
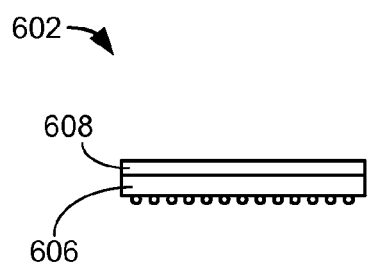
FIG. 8 is a peripheral end view of the first riser of FIG. 6.

Referring now to FIG. 8, therein is shown a peripheral end view of the first riser 602 of FIG. 6. The peripheral end view is taken from the peripheral end 108 of FIG. 6 of the carrier 102 of FIG. 6. The peripheral end view can include the body portion 606 and the protrusion portion 608.

The protrusion portion 608 extends beyond the body portion 606 from the peripheral end 108 and a side opposite to the peripheral end 108 (not shown). The top surface of the first riser 602 can include a width of 11.00 mm, measured from the extraction end 202 of FIG. 2 of the carrier 102 to the insertion end 204 of FIG. 2 of the carrier 102.

The vertical height of the first riser 602 can be from 1.10 mm to 1.60 mm, measured from the bottom surface of the body portion 606 to the top surface of the protrusion portion 608. Further for example, the height of the base portion can be 1.00 mm and the vertical height of the protrusion portion can be 0.60 mm.

It has been found that the overlapping configuration of the integrated circuit device system 600, from the first riser 602, provides cooling, buffer space between components, and airflow in combination with an increased capacity for mounting chips on the carrier 102.

Figure 9:
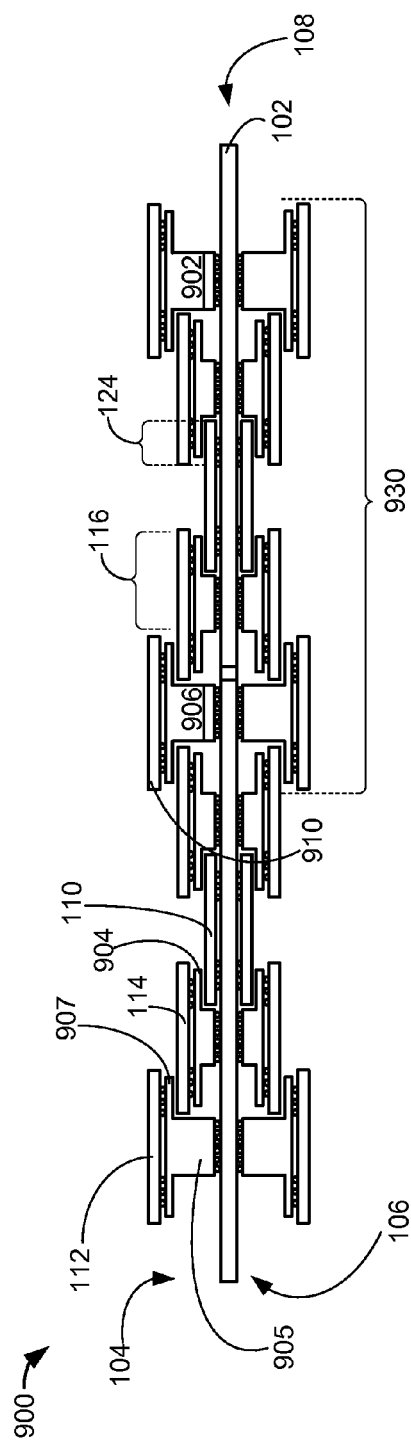
FIG. 9 is a top view of the integrated circuit device system in a third embodiment of the present invention.

Referring now to FIG. 9, therein is shown top view of the integrated circuit device system 900 in a third embodiment of the present invention. The integrated circuit device system 900 and be identical to the integrated circuit device system 600 of FIG. 6 except that the integrated circuit device system 900 can include a first riser 902, a second riser 904, and a third riser 906. The first riser 902, the second riser 904, and the third riser 906 can each include a "T-shaped" configuration.

It is understood that the integrated circuit device system 900 can include identical elements and components as the integrated circuit device system 100 of FIG. 1 and the integrated circuit device system 600 of FIG. 6. For example, the integrated circuit device system 900 can include the base device 110, the peripheral elevated device 112, the inner elevated device 114, and the device interconnect 126 of FIG. 6.

The second riser 904 can be identical to the second riser 604 of FIG. 6. For example, the second riser 904 can include the body portion 606 of FIG. 6 and the protrusion portion 608 of FIG. 6. The inner elevated device 114 of FIG. 6 can be directly attached to the top surface of the second riser 904. The second riser 904 can be between the first riser 902 and the base device 110 on the carrier 102.

The first riser 902 can be mounted immediately adjacent to the peripheral end 108 of the carrier 102, with no intervening elements between the first riser 902 and the peripheral end 108. The first riser 902 can be structurally similar to the second riser 904 except that the first riser 902 includes a vertical height that extends above the inner elevated device 114 and the second riser 904.

The vertical height can be measured as a distance away from the surface of the carrier 102, using the carrier 102 as a starting point. For example, the first riser 902 can have a vertical height of 3.00 mm to 6.00 mm, depending on the configuration of the integrated circuit device system 900. The peripheral elevated device 112, mounted to the first riser 902, can include the length 116 of 11.00 mm as an example.

The first riser 902 can include a body portion 905 and a protrusion portion 907. The body portion 905 of the first riser 902 provides a base for components and devices mounted thereon. The body portion 905 is mounted directly to the carrier 102. The first riser 902 can include the length 116 of 10.00 mm as an example.

The protrusion portion 907 of the first riser 902 extends from the body portion 905. The protrusion portion 907 can protrude towards the peripheral end 108 of the carrier 102 and towards another of the peripheral end 108 at the opposite end of the carrier 102. The protrusion portion 907 and the top surface of the first riser 902 can provide additional mounting space for components to be mounted above the carrier 102, the base device 110, and the inner elevated device 114.

The protrusion portion 907 can overhang the inner elevated device 114 that is mounted to the second riser 904. The peripheral elevated device 112 can be directly mounted to the first riser 902. The device overhang 124 for the protrusion portion 907 can be between 0.14 mm to 2.00 mm, as examples.

The third riser 906, such as a center riser, can be identical to the first riser 902 except that the third riser 906 is mounted to a central position on the first side 104. For example, the third riser 906 can be mounted in a position on the first side 104 that is an equal distance from the peripheral end 108 and another of the peripheral end 108 at the opposite end of the carrier 102.

The integrated circuit packaging system 900 can include a central elevated device 910. The central elevated device 910 can be identical to the peripheral elevated device 112 except that the central elevated device 910 is directly mounted to the third riser 906.

The first riser 902, the second riser 904, and the third riser 906 provide for three horizontal levels for mounting devices on the carrier 102. For example, the first riser 902 provides for the peripheral elevated device 112 to be mounted above the inner elevated device 114. The second riser 904 provides for the inner elevated device 114 to be mounted over the base device 110 and below the peripheral elevated device 112. The third riser 906 provides for the central elevated device 910 to be mounted over the inner elevated device 114 at a midpoint of the first side 104.

The first riser 902, second riser 904, and third riser 906 can also include a redistribution layer and vias for interconnection between the carrier 102 and other elevated devices. The integrated circuit device system 900 can include a mirrored chip assembly 930 mounted to the second side 106 of the carrier 102.

The mirrored chip assembly 930 is similar to the mirrored chip assembly 130 of FIG. 1 and the mirrored chip assembly 640 of FIG. 6. The mirrored chip assembly 909 can include identical components that are mounted to the first side 104, having the same position and configuration on the second side 106. For example, the mirrored chip assembly 930 can include an identical set of the third riser 906, the central elevated device 910, the first riser 902, the second riser 904, the peripheral elevated device 112, the inner elevated device 114, and the base device 110.

It has been discovered that the first riser 902, second riser 904, and third riser 906 provide three different horizontal levels of additional mounting space for components on the carrier 102. It has been found that the first riser 902 provides additional space for larger devices to be mounted over smaller devices. For example, the peripheral elevated device 112, mounted to the first riser 902 and overhanging the inner elevated device 114, can be equal to, smaller, or larger in dimensions than the inner elevated device 114 because of the overhanging position.

It has been discovered that the body portion 905 and the protrusion portion 907 of the first riser 902 further increases the capacity of carrier 102 to hold more devices. It has been found that the narrow dimensions or narrow length of the body portion 905 provide for more chips or longer chips to be mounted to the carrier 102. If has been also found that the vertical height of the body portion 905, which extends above the inner elevated device 114, provides an additional horizontal level for mounting components.

It has been found that the protrusion portion 907 provides for devices of multiple sizes to be mounted above the base device 110 and the carrier 102 because of the protrusion portion 907 extends the mounting area beyond the length 116 of the body portion 905. It has been discovered that the configuration and spacing of the base device 110, the peripheral elevated device 112, the inner elevated device 114, the first riser 902, and the second riser 904 provides additional space on the carrier 102 for increasing the capacity of carrier 102 to hold more devices.

It has been found that the elevated or stacked arrangement of chips on the first riser 902, the second riser 904, and the third riser 906 provide for the peripheral elevated device 112 and the inner elevated device 114 to be elevated above the base device 110 for increasing the capacity of devices on the carrier 102. For example, the device overhang 124, where the peripheral elevated device 112 and the inner elevated device 114 are suspended over the base device 110 and the carrier 102, increases the mountable area for mounting memory modules.

It has been found that the elevated or stacked configuration and arrangement of the integrated circuit device system 900 can be used with standardized and uniform devices or customized devices with different sizes and dimensions. For example, the elevated arrangement and the device overhang 124, from the first riser 902, the second riser 904, and third riser 906, provide a system that allows uniform sized chips and chips with different dimensions to be mounted on the carrier 102.

Further, it has been found that the device overhang 124 allows for devices of different sizes to be arranged on the carrier 102. For example, the base device 110 can have a different value for the length 116 than the peripheral elevated device 112 and the inner elevated device 114. Further for example, the device overhang 124 allows the peripheral elevated device 112 and the inner elevated device 114 to have different lengths or different overlaps with the base device 110. The variations between the lengths of the peripheral elevated device 112 and the inner elevated device 114 are limited by the mounting space on the carrier 102 and the space required to keep chips from contacting each other.

It has been found that the overlapping configuration of the integrated circuit device system 900 provides cooling and air flow in combination with the increased amount of chips mounted in the same mounting area. Further, it has been found that the heights, spaces, and distances between the base device 110, the peripheral elevated device 112, the inner elevated device 114, the first riser 902, the second riser 904, and the third riser 906 provide for air-cooling and for buffering of space to prevent physical damage between components from temporary warpage and component shifting.

Further, it has been found that the mirrored chip assembly 930 further increases the capacity of devices that can be mounted on the carrier 102. The base device 110, the peripheral elevated device 112, the inner elevated device 114, the first riser 902, the second riser 904, and the third riser 906 can have an identical copy in the mirrored chip assembly 930 mounted to the second side 106.

It has been also found that the mirrored chip assembly 930 allows for an identical manufacturing process for the second side 106 as for the first side 104, which simplifies manufacturing steps and increases production yield.

Figure 10:
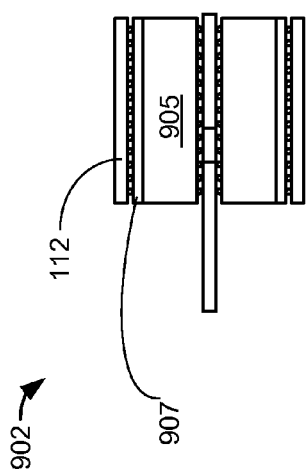
FIG. 10 is a peripheral end view of the first riser of FIG. 9

Referring now to FIG. 10, therein is shown a peripheral end view of the first riser 902 of FIG. 9. The peripheral end view is taken from the peripheral end 108 of FIG. 9 of the carrier 102 of FIG. 9. The peripheral end view can include the body portion 905, the protrusion portion 907, and the peripheral elevated device 112.

The protrusion portion 907 extends beyond the body portion 905 from the peripheral end 108 and a side opposite to the peripheral end 108 (not shown). The top surface of the first riser 902 can include a width of 11.00 mm measured from the extraction end 202 of FIG. 2 of the carrier 102 to the insertion end 204 of FIG. 2 of the carrier 102. The height of the peripheral elevated device 112 from the top surface of the first side 104 to the top surface of the peripheral elevated device 112 can be 5.10 mm as an example.

Further, it has been found that the heights and distances of the integrated circuit device system 900, including the total vertical height of 5.10 mm for the peripheral elevated device 112, provides a low profile memory device but also provides mounting space for additional mounting capacity on the carrier 102.

Figure 11:
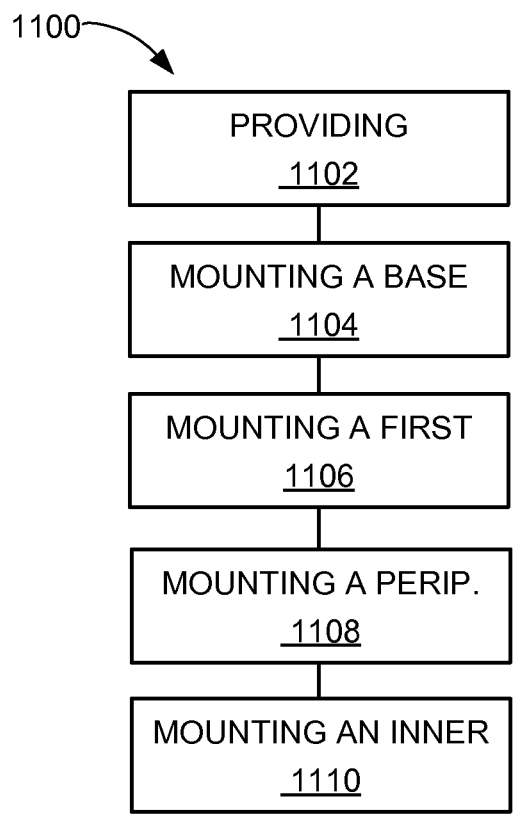
FIG. 11 is a flow chart of a method of manufacture of the integrated circuit device system in a further embodiment of the present invention.

Referring now to FIG. 11, therein is shown a flow chart of a method 1100 of manufacture of the integrated circuit device system in a further embodiment of the present invention. The method 1100 includes providing a carrier having a first side in a block 1102; mounting a base device on the first side in a block 1104; mounting a first riser and a second riser on the first side in a block 1106; mounting a peripheral elevated device on the first riser, the peripheral elevated device having a device overhang above the base device in a block 1108; and mounting an inner elevated device on the second riser, the inner elevated device having the device overhang above the base device in a block 1110.

Thus, it has been discovered that the integrated circuit device system of the present invention furnishes important and heretofore unknown and unavailable solutions, capabilities, and functional aspects for increasing the performance and capacity of electronic and memory devices. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit device systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit device system comprising:
   providing a carrier having a first side;
   mounting a base device on the first side;
   mounting a first riser, adjacent to the base device, and a second riser, adjacent to a side of the base device opposite the first riser, on the first side;
   mounting a peripheral elevated device on the first riser, the peripheral elevated device having a device overhang above the base device; and
   mounting an inner elevated device on the second riser, the inner elevated device having the device overhang above the base device.

2. The method as claimed in claim 1 wherein mounting the peripheral elevated device includes mounting the peripheral elevated device having the device overhang of at most half the length of the peripheral elevated device.

3. The method as claimed in claim 1 further comprising mounting a mirrored chip assembly to a second side of the carrier.

4. The method as claimed in claim 1 wherein mounting a first riser includes mounting the first riser having a protrusion portion, the protrusion portion overhanging the base device.

5. The method as claimed in claim 1 wherein mounting the peripheral elevated device includes a device interconnect between the first riser and the peripheral elevated device.

6. A method of manufacture of an integrated circuit device system comprising:
   providing a carrier having a first side;
   mounting a base device on the first side;
   mounting a first riser, adjacent to the base device, and a second riser, adjacent to a side of the base device opposite the first riser, on the first side, the base device between the first riser and the second riser;
   mounting a peripheral elevated device on the first riser, the peripheral elevated device having a device overhang above the base device; and
   mounting an inner elevated device on the second riser, the inner elevated device having the device overhang above the base device.

7. The method as claimed in claim 6 wherein mounting a first riser can include mounting the first riser having a body portion and a protrusion portion extending from the body portion, the protrusion portion overhanging the base device.

8. The method as claimed in claim 6 further comprising mounting a mirrored chip assembly to a second side of the carrier, the mirrored chip assembly includes a mirrored periphery device, a mirrored first riser, a mirrored base device, a mirrored inner device, and a mirrored second riser.

9. The method as claimed in claim 6 wherein mounting the inner elevated device can include mounting the inner elevated device having the device overhang of at least half the length of the inner elevated device.

10. The method as claimed in claim 6 wherein mounting the peripheral elevated device includes mounting the peripheral elevated device above the inner elevated device.

11. An integrated circuit device system comprising:
    a carrier having a first side;
    a base device mounted on the first side;
    a first riser, mounted on the first side, adjacent to the base device;
    a second riser, mounted on the first side, adjacent to a side of the base device opposite the first riser;
    a peripheral elevated device mounted on the first riser, the peripheral elevated device having a device overhang above the base device; and
    an inner elevated device mounted on the second riser, the inner elevated device having the device overhang above the base device.

12. The system as claimed in claim 11 wherein the peripheral elevated device includes the device overhang of at most half the length of the peripheral elevated device.

13. The system as claimed in claim 11 further comprising a mirrored chip assembly mounted to a second side of the carrier.

14. The system as claimed in claim 11 wherein the first riser includes a protrusion portion, the protrusion portion overhanging the base device.

15. The system as claimed in claim 11 further comprising a device interconnect for attaching the peripheral elevated device to the first riser.

16. The system as claimed in claim 11 wherein the first riser and the second riser include vertical vias.

17. The system as claimed in claim 16 wherein a first riser can include a body portion and a protrusion portion extending from the body portion, the protrusion portion overhanging the base device.

18. The system as claimed in claim 16 further comprising a mirrored chip assembly attached to a second side of the carrier, the mirrored chip assembly includes a mirrored periphery device, a mirrored first riser, a mirrored base device, a mirrored inner device, and a mirrored second riser.

19. The system as claimed in claim 16 wherein the inner elevated device can include the device overhang of at least half of the length of the inner elevated device.

20. The system as claimed in claim 16 wherein the peripheral elevated device is mounted above the inner elevated device.

* * * * *